United States Patent
Bae et al.

(10) Patent No.: US 8,147,902 B2
(45) Date of Patent: Apr. 3, 2012

(54) ELECTRO LUMINESCENCE DISPLAY DEVICE AND FABRICATING METHOD AND APPARATUS THEREOF

(75) Inventors: Sung Joon Bae, Kyounggi-do (KR); Hee Suk Pang, Kyounggi-do (KR); Kyung Man Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 956 days.

(21) Appl. No.: 11/327,329

(22) Filed: Jan. 9, 2006

(65) Prior Publication Data

US 2006/0116047 A1    Jun. 1, 2006

Related U.S. Application Data

(62) Division of application No. 10/733,403, filed on Dec. 12, 2003, now Pat. No. 7,154,217.

(30) Foreign Application Priority Data

Dec. 31, 2002 (KR) ............................... P2002-88439
Mar. 20, 2003 (KR) ............................... P2003-17453

(51) Int. Cl.
*B05D 5/06* (2006.01)

(52) U.S. Cl. ..................................... 427/64; 118/200

(58) Field of Classification Search .................. 427/64, 427/66–68; 101/212, 250; 118/200
See application file for complete search history.

(56) References Cited

U.S. PATENT DOCUMENTS

| 6,436,265 | B1 * | 8/2002 | Shimada et al. ............... 205/125 |
| 6,582,504 | B1 * | 6/2003 | Fujita ............................. 106/311 |
| 6,933,671 | B2 | 8/2005 | Nakanishi ..................... 313/500 |
| 2002/0047567 | A1 | 4/2002 | Fujita et al. |
| 2003/0030766 | A1 * | 2/2003 | Kiguchi et al. ............... 349/106 |
| 2003/0123018 | A1 * | 7/2003 | Kim et al. ..................... 349/155 |

FOREIGN PATENT DOCUMENTS

| JP | 2001-351787 | 12/2001 |
| JP | 2002-83691 | 3/2002 |
| JP | 2002-222695 | 8/2002 |
| JP | 2002-252083 | 9/2002 |
| WO | WO 02/099477 A1 | 12/2002 |

* cited by examiner

*Primary Examiner* — Michael Cleveland
*Assistant Examiner* — Robert Vetere
(74) *Attorney, Agent, or Firm* — Morgan, Lewis & Bockius LLP

(57) ABSTRACT

An electro luminescence display device having a display area and a non-display area includes a plurality of display organic light emission layers formed in the display area and a dummy organic light emission layer formed in the non-display area.

5 Claims, 18 Drawing Sheets

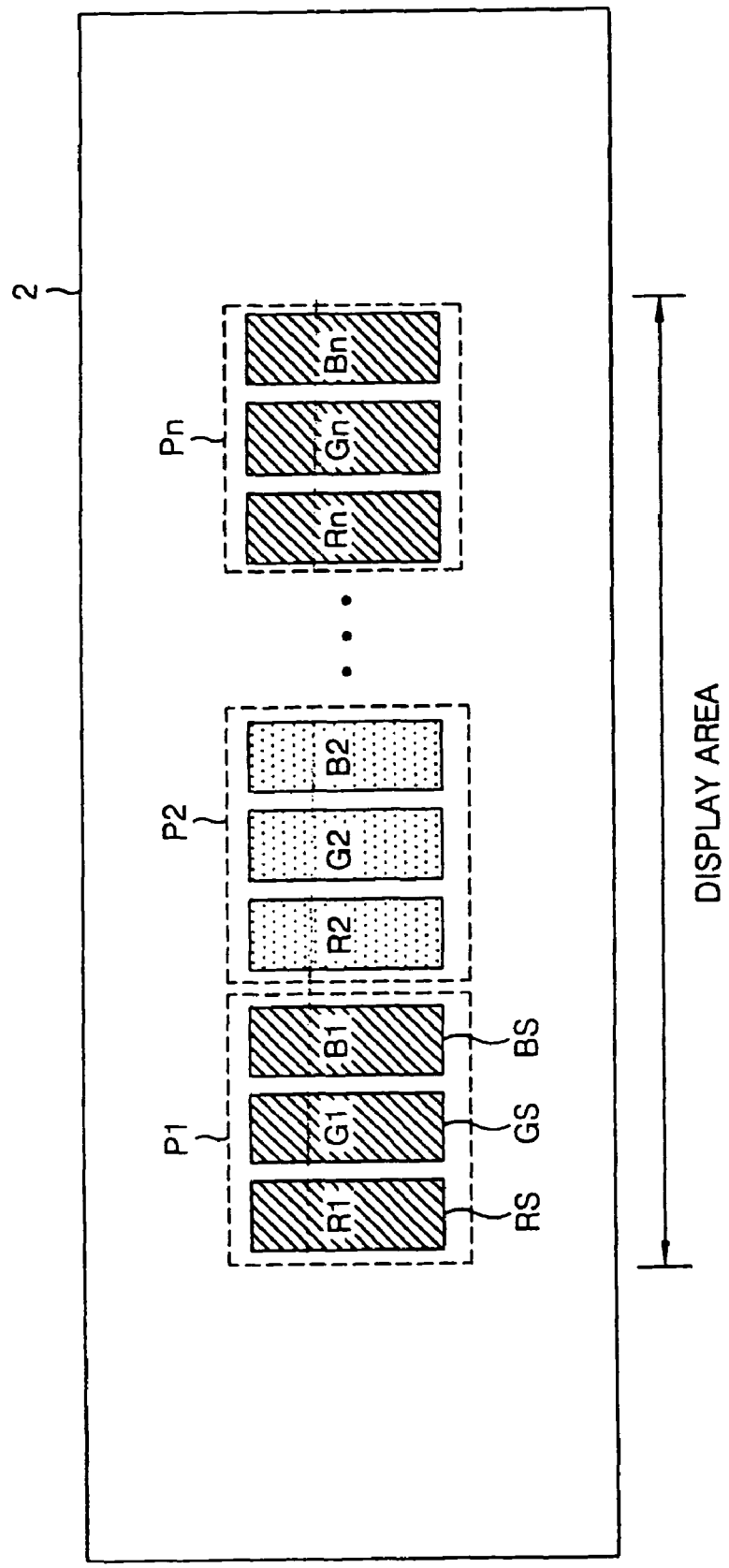

US 8,147,902 B2

ELECTRO LUMINESCENCE DISPLAY DEVICE AND FABRICATING METHOD AND APPARATUS THEREOF

This application is a divisional of U.S. patent application Ser. No. 10/733,403, now U.S. Pat. No. 7,154,217, filed Dec. 12, 2003, which is hereby incorporated by reference. This application also claims the benefit of Korean Patent Application Nos. P2002-088439 filed on Dec. 31, 2002 and P2003-17453 filed on Mar. 20, 2003, which are hereby incorporated by reference.

BACKGROUND OF THE INVENTION

1. Field of the Invention

The present invention relates to an electro luminescence display device, and more particularly to a fabricating method and apparatus thereof for preventing the deterioration of picture quality.

2. Description of the Related Art

Recently, various flat panel displays have been developed. Flat panel displays have the advantages of reduced weight and reduced bulk over a Cathode Ray Tube (CRT). Such flat panel displays include a Liquid Crystal Display (LCD), a Field Emission Display (FED), a Plasma Display Panel (PDP), and Electro Luminescence (hereinafter, EL) display device.

The structure and fabricating process of the PDP is relatively simple compared to the LCD, FED and EL devices. Another advantage of the PDP is that it can be made to have a large size but yet be lightweight. However, the light emission efficiency and brightness of a PDP are low while its power consumption is high.

Compared to a PDP, an LCD is difficult to make because of the semiconductor processing for making the Thin Film Transistor (TFT), which is used as a switching device in each of the pixels in the LCD. The demand for LCDs has been increasing with the increasing demand of notebook computers because it is typically used as the display device of a notebook computer. However, the LCD has a disadvantage in that power consumption is high because the LCD uses a backlight unit. Further, the LCD also has the disadvantage of high light loss caused by the use of optical devices, such as a polarizing filter, a prism sheet, a diffusion panel. Another disadvantage of the LCD is a narrow viewing angle.

EL display devices are generally classified as either an inorganic EL device or an organic EL device depending on the material of a light-emission layer of the EL display device. Since an EL device is a self-luminous device, it has the advantages of a fast response speed, a high light-emission efficiency and high brightness. In addition, an EL device has the advantage of a wide viewing angle.

FIG. 1 is a sectional view representing an electro luminescence display device of the related art. As shown in FIG. 1, the organic EL display device includes a hole injection layer 22, a light emission layer 24, an electron injection layer 26 deposited between a cathode 28 and an anode 20 on a substrate 2. If a drive voltage is applied across the anode 20 and the cathode 28 in the organic EL display device, holes in the hole injection layer 22 and electrons in the electron injection layer 26 move into the light emission layer 24 and excite a fluorescent material within the light emission layer 24. Accordingly, a picture or an image is displayed by the visible light generated from the light emission layer 24 when a plurality of EL display devices are used together in an active matrix EL display panel.

FIG. 2 is a circuit diagram representing a sub-pixel of an electro luminescence display device of the related art. As shown in FIG. 2, the active matrix EL display panel using the EL display device includes sub pixels 150 each arranged at each intersection area of gate lines GL and data lines DL. Each sub pixel 150 receives a data signal from the data line DL and generates light corresponding to the data signal when a gate pulse is applied to a gate line GL. Each sub-pixel 150 includes an EL cell OEL having its cathode connected to a ground voltage source GND, and a cell driver 152 connected to the gate line GL, the data line DL, a supply voltage source VDD and to the anode of the EL cell OEL for driving the EL cell OEL. The cell driver 152 includes a switch thin film transistor T1, a drive thin film transistor T2 and a capacitor C.

The switch thin film transistor T1 is turned on to apply a data signal applied to the data line DL to a first node N1 when a scan pulse is applied to the gate line GL. The data signal applied to the first node N1 charges the capacitor C and at the same time is applied to the gate terminal of the drive thin film transistor T2. The drive thin film transistor T2 controls the amount of current I applied to the EL cell OEL from the supply voltage source in response to the data signal applied to the gate terminal such that the amount of light emission from EL cell OEL is controlled. The EL cell OEL sustains light emission, even though the switch thin film transistor T1 is turned off, by current I provided to EL cell OEL from the supply voltage source through the drive thin film transistor T2 until the data signal of the next frame is applied because the voltage of the data signal is maintained by the discharging of the capacitor C.

FIG. 3 is a plan view of the cell driver shown in FIG. 2. As shown in FIG. 3, a relate art cell driver includes a drive thin film transistor T2 formed adjacent to an intersection of the gate line GL and a supply line RL. Further, the gate 104 of the drive thin film transistor T2 is connected to a switch thin film transistor T1. The switch thin film transistor T1 includes a gate electrode 130 formed of the gate line GL, a source electrode 106 from the data line DL, a drain electrode 108 connected through a connection contact hole 118 to a gate electrode 104 of the drive thin film transistor T2, and an active layer 102 forming a conduction channel between the source electrode 106 and the drain electrode 108 when a voltage is applied to the gate electrode 130. The active layer 102 is connected to the source electrode 106 and the drain electrode 108 through a first and a second switch contact holes 116a and 116b, respectively.

The drive thin film transistor T2 includes a gate electrode 104 connected to the drain electrode of the switch thin film transistor T1, a source electrode 112 connected to a supply line RL through a supply contact hole 134, a drain electrode 110 connected to a pixel electrode 100 through a pixel contact hole 132, and an active layer 114 forming a conduction channel between the source electrode 112 and the drain electrode 110 when a voltage is applied to the gate electrode 104. The active layer 114 is connected to the source electrode 112 and the drain electrode 110 through a first and a second switch contact holes 120a and 120b, respectively. The drive thin film transistor T2 applies a supply voltage signal VDD from the supply line RL to the pixel electrode 100, which acts as an anode for an organic EL layer (not shown), in response to the data signal from the gate electrode 104. An organic EL layer (not shown) and a cathode (not shown) are sequentially formed on the pixel electrode 100 to complete the organic EL sub pixel.

In the related art, an organic EL layer is patterned and formed by a vacuum deposition method, a coating method using a spray head or a printing system. FIG. 4 is a diagram representing an apparatus for fabricating an electro luminescence display device of the related art using a printing system. As shown in FIG. 4, an apparatus for fabricating a related art organic EL device includes a supply roller 8 having EL material on the supply roller, a print roller 4 having a resin plate 6 for receiving the EL material from the supply roller 8 and a substrate 2 loaded under the print roller 4.

Either red R, green G or blue B EL materials are dropped on the supply roller 8 from a dispenser 10 positioned above the supply roller 8. A blade 16 is positioned close to the supply roller 8 to spread the EL material uniformly on the resin plate 6. The print roller 4, while rotating by a turning force, transfers the EL material on the supply roller 8 to a groove of the resin plate 6 and then the print roller subsequently rotates to print the EL material on the substrate 2.

FIG. 5 is a perspective view of the related art resin plate shown in FIG. 4. FIG. 6 is a sectional view of the related art resin plate shown in FIG. 4. The resin plate 6, as shown in FIGS. 5 and 6, includes a base surface 14 and a first to an $n^{th}$ pattern line SL1 to SLn formed to be projected from the base surface 14. The first to $n^{th}$ pattern lines SL1 to SLn are formed at locations corresponding to a first to an $n^{th}$ sub-pixel area P1 to Pn on the substrate 2 in the same shape as the pixel formed on the substrate 2. As shown in FIG. 5, the pattern lines SL are formed as raised stripes with a designated gap therebetween. On the surface of each of the pattern lines SL, there are formed a plurality of hemispherical shape grooves 30, as shown in FIG. 6. The pattern lines SL contact the supply roller 8 containing the EL material such that the EL material is uniformly spread on the pattern lines SL with a predetermined thickness for transferred onto the substrate 2. A print table 1 having the substrate 2, which is to be printed, is loaded by a loading device (not shown) below the print roller 4. The substrate 2 can already have an electrode pattern and various material layers formed thereon for an EL display device configuration.

After the substrate 2 on the print table 1 is loaded, the EL material is supplied from the dispenser 10 onto the surface of the supply roller 8. The EL material is then provided in the pattern lines SL of the resin plate 6 when the print roller 4 rotates across the resin plate 6. After being printed on the corresponding substrate 2, the EL material is cured to form an EL layer on the substrate 2. In this way, an EL layer of a specific color, such as red, is formed, and then the EL layers of the other colors, such as green and blue, are subsequently formed in the same way.

The first and the $n^{th}$ pattern lines SL1 and SLn among the pattern lines SL of the related art organic EL display device are formed in a different shape from the other pattern lines. That is, as shown in FIG. 6, the side surface of the first and $n^{th}$ pattern lines SL1 and SLn adjacent to the outer area of the base surface 14 has gap with a first depth h1, and the other side surface of the first and $n^{th}$ pattern lines SL1 and SLn adjacent to the other pattern lines has a gap with second depth h2 lower than the first depth h1. The other pattern lines SL2 to SLn-1 except for the first and $n^{th}$ pattern lines SL1 and SLn are formed to have gaps in between that are at the second depth h2.

The different depths of the gaps are caused by a photolithography process that includes an etching process that etches relatively more at the side surfaces adjacent to edges of the base surface 14 as opposed to in between the pattern lines. FIG. 7A to 7C are diagrams representing an organic EL layer formed using pattern lines shown in FIGS. 5 and 6. FIG. 8 is a plan view representing a bad pattern of an organic EL layer formed using the pattern lines shown in FIGS. 5 and 6.

In the event that a red organic EL material is printed using the first and $n^{th}$ pattern lines SL1 and SLn, a bad pattern occurs because the first and $n^{th}$ pattern lines SL1 and SLn are etched relatively more, as shown in FIG. 7A. Thus, there is a problem in that a bad printing occurs in the first and $n^{th}$ red sub-pixel areas R1 and Rn, which are formed at both edge end parts of a display area. In the same manner, in the event of a subsequent sequentially printing of the green and blue organic EL materials, as shown in FIGS. 7B and 7C, there is a problem that bad printing occurs in the first and $n^{th}$ green sub-pixel areas G1 and Gn and in the first and $n^{th}$ blue sub-pixel areas B1 and Bn, which are both formed at edge end parts of a display area. Thus, as shown in FIG. 8, there is a problem in that bad picture quality occurs in the first and $n^{th}$ pixels P1 and Pn, which consist of a red R, a green G and a blue B sub-pixels having a badly printed organic EL layer. Because it is difficult to fix specific areas of the organic EL display device, the organic EL display device may have to be discarded.

SUMMARY OF THE INVENTION

Accordingly, it is an object of the present invention to provide an electro luminescence display device, and a fabricating method and apparatus thereof that substantially obviate one or more of the problems due to limitations and disadvantages of the related art.

An object of the present invention is to print organic emission layers of an electro luminescence display device without printing errors.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the electro luminescence display device having a display area and a non-display area according to an aspect of the present invention includes a plurality of display organic light emission layers formed in the display area and a dummy organic light emission layer formed in the non-display area.

In another aspect, a fabricating apparatus of an electro luminescence display device according to another aspect of the present invention includes a first roller to be spread with an organic material that is externally supplied to the first roller, a second roller adjacent to the first roller and rotating and a resin plate attached to the second roller and being in contact with the organic material on the first roller, wherein the resin plate has a plurality of display concavo-convex patterns formed at an area corresponding to a display area of a substrate, and has at least one dummy concavo-convex pattern formed at an area corresponding to a non-display area of the substrate.

In another aspect, a fabricating method of an electro luminescence display device includes attaching to a roller a resin plate with a plurality of display concavo-convex patterns formed at a location corresponding to a display area of a substrate and with at least one dummy concavo-convex pattern formed at a location corresponding to a non display area of the substrate, supplying an organic material to the resin plate and printing the organic material spread on the resin plate to the substrate by rotating the roller.

In another aspect, a method of making an electro luminescence display device having a display area and a non-display area includes providing electro luminescent material on a resin plate, forming a plurality of display organic light emission layers in the display area and a dummy organic light emission layer in the non-display area by applying the resin plate to a substrate.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 8 is a plan view representing a bad pattern for an organic EL layer formed using the pattern lines shown in FIGS. 5 and 6.

DETAILED DESCRIPTION OF THE PREFERRED EMBODIMENTS

Reference will now be made in detail to the preferred embodiments of the present invention, examples of which are illustrated in the accompanying drawings.

Figure 1:
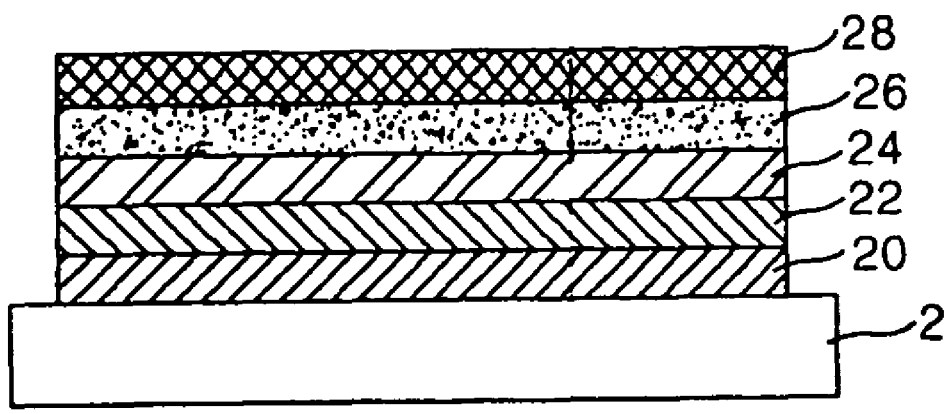
FIG. 1 is a sectional view representing an electro luminescence display device of the related art.
Figure 2:
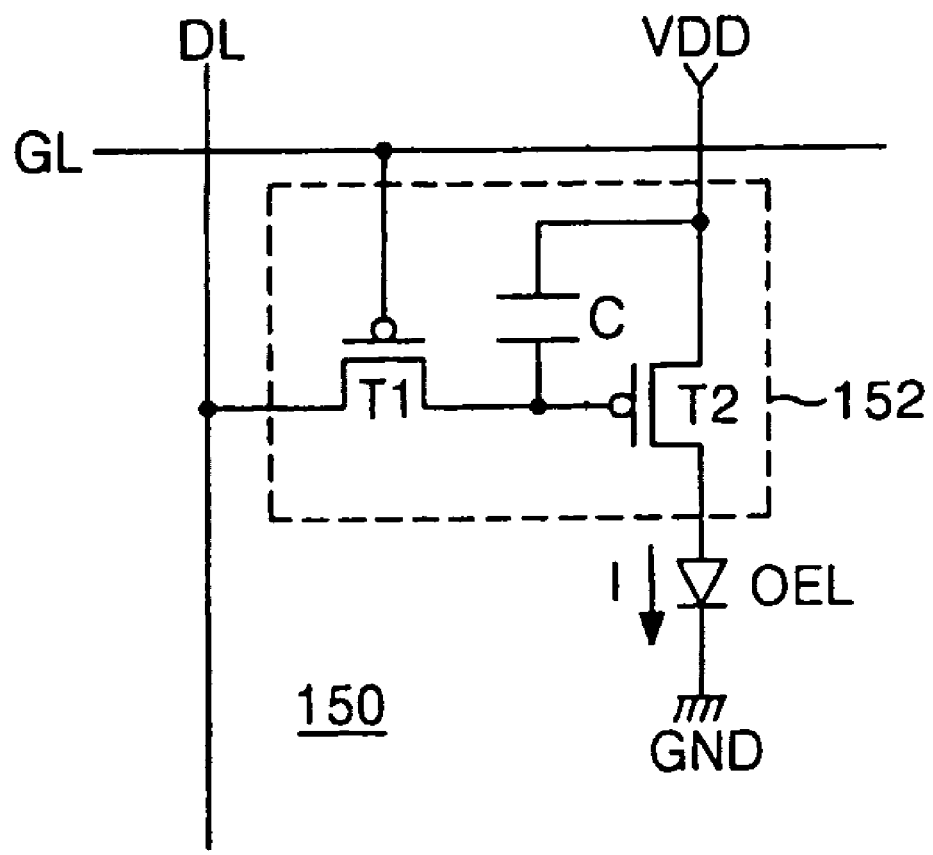
FIG. 2 is a circuit diagram representing a sub-pixel of an electro luminescence display device of the related art.
Figure 3:
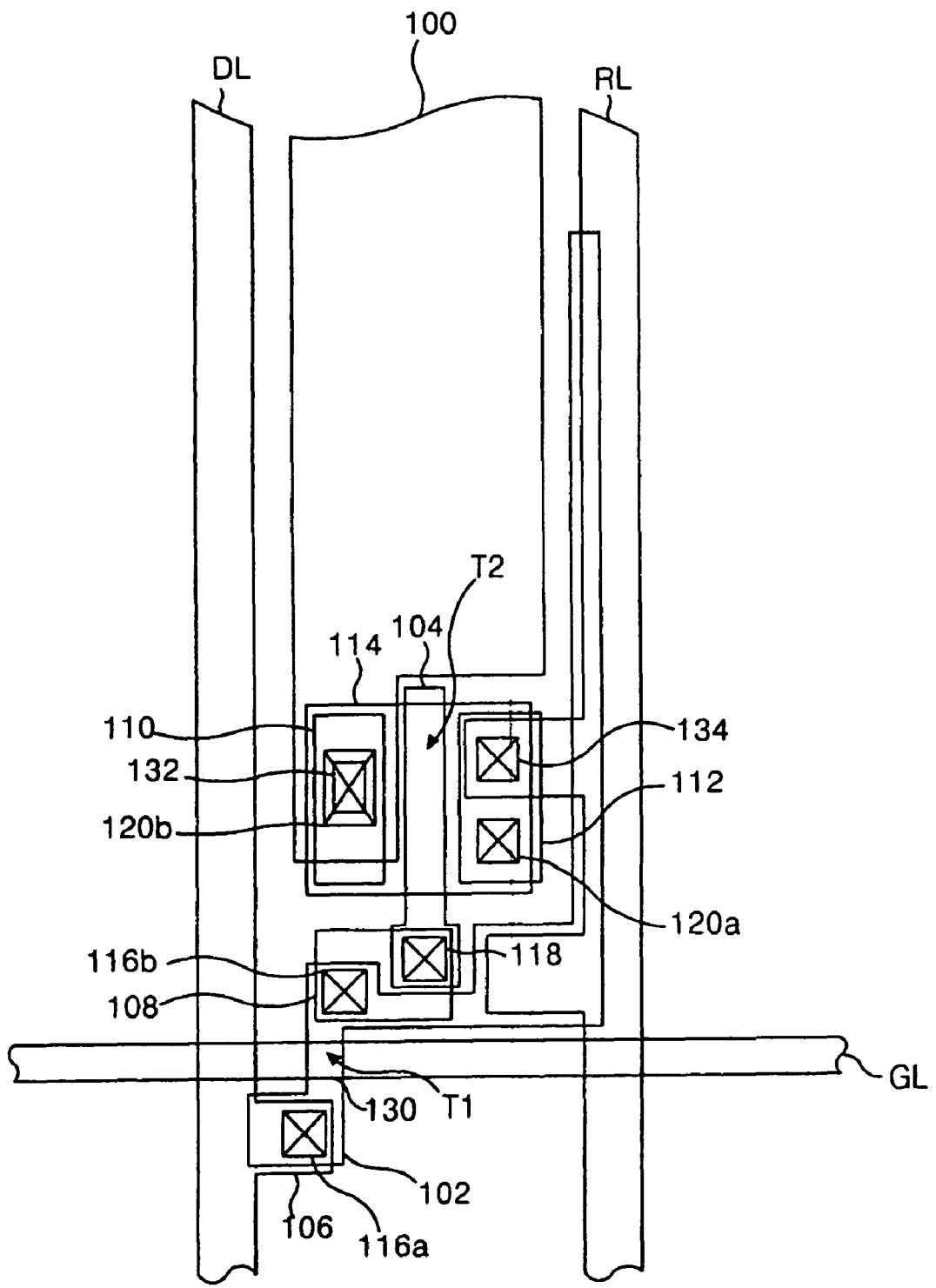
FIG. 3 is a plan view of the sub-pixel shown in FIG. 2.
Figure 4:
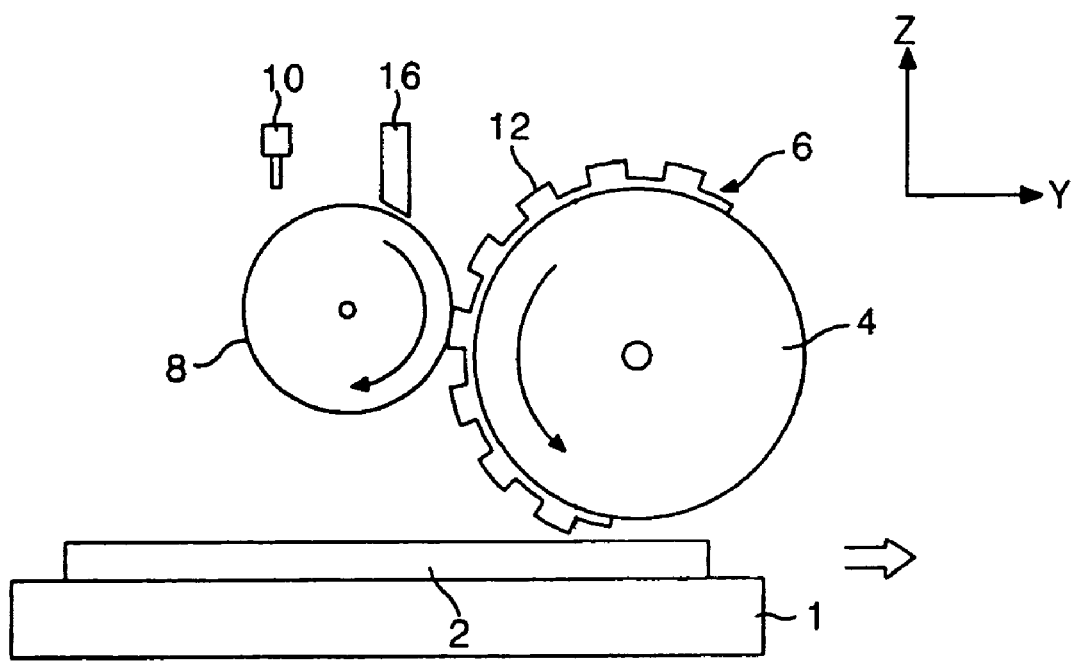
FIG. 4 is a diagram representing an apparatus for fabricating an electro luminescence display device of the related art using a printing system.
Figure 5:
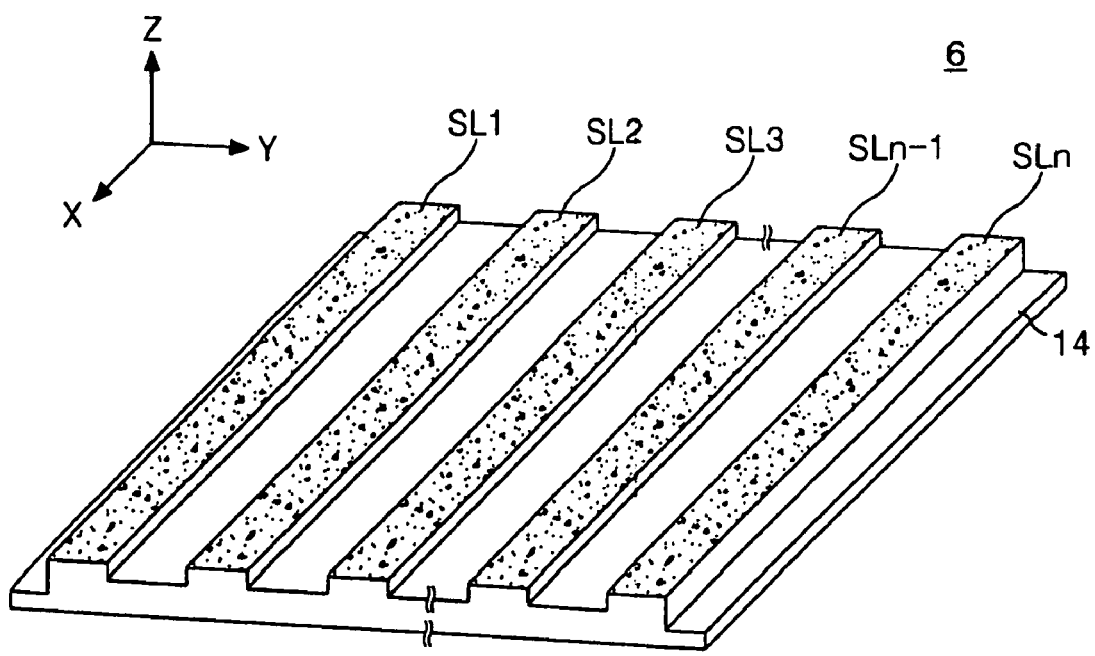
FIG. 5 is a perspective view of the related art resin plate shown in FIG. 4.
Figure 6:
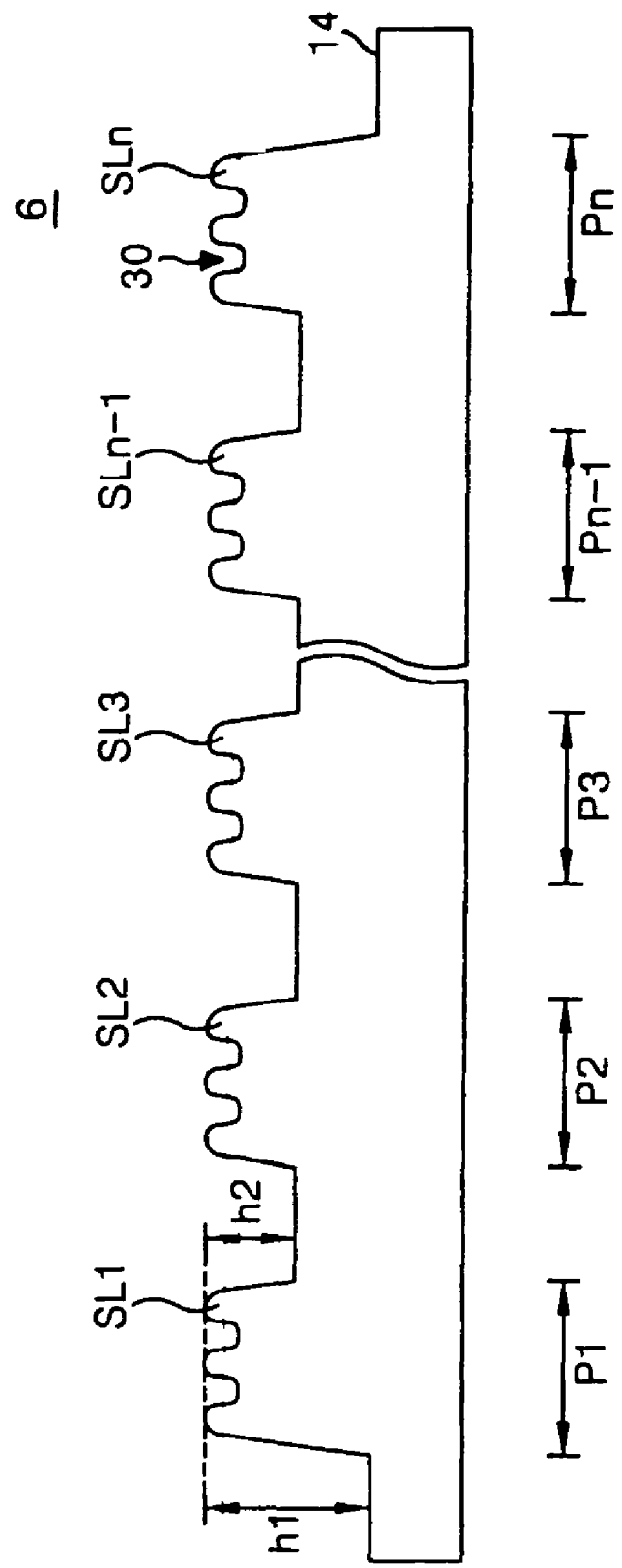
FIG. 6 is a sectional view of the related art resin plate shown in FIG. 4.
Figure 7A:
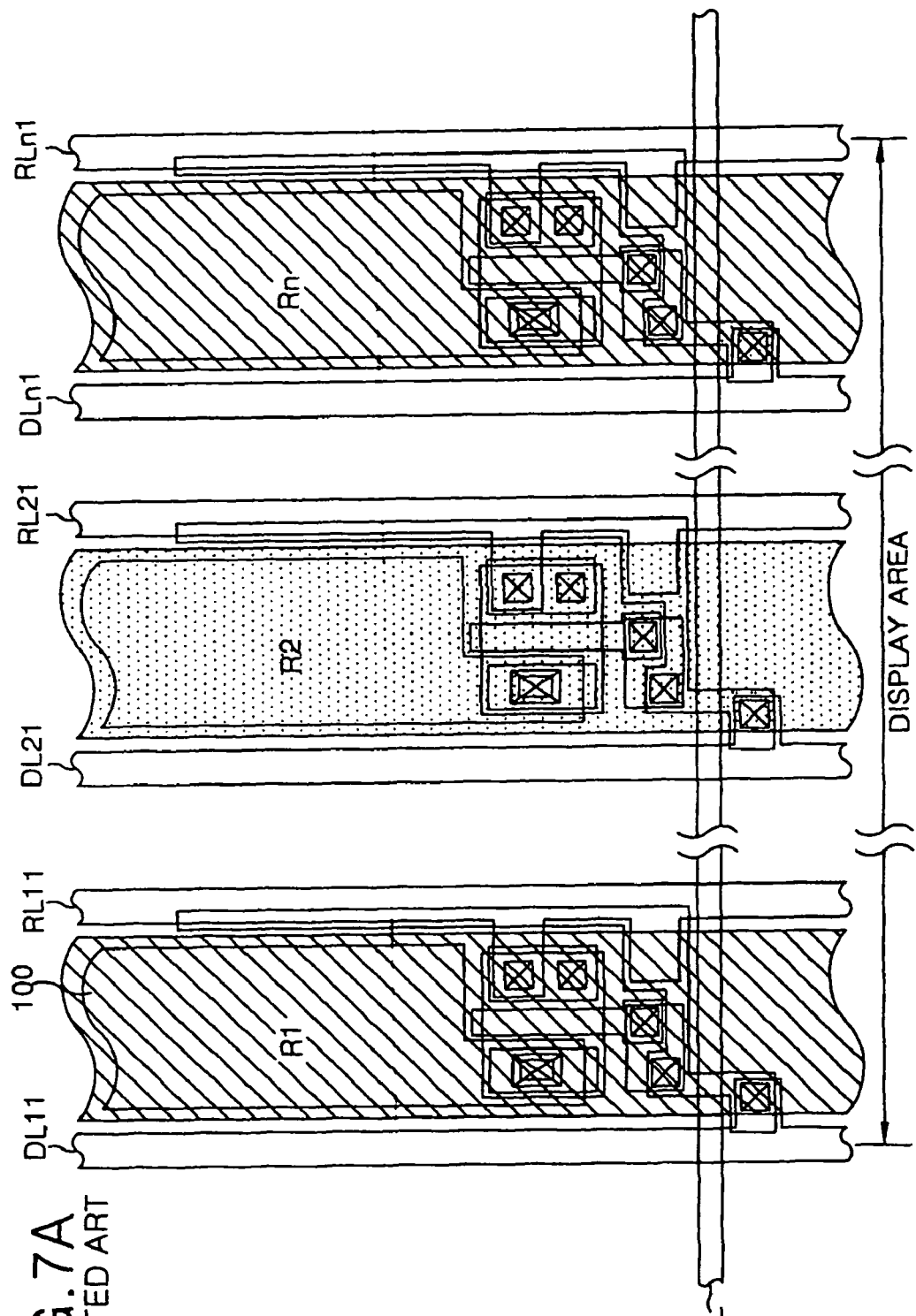
FIG. 7A to 7C are diagrams representing an organic EL layer formed using the pattern lines shown in FIGS. 5 and 6.
Figure 7B:
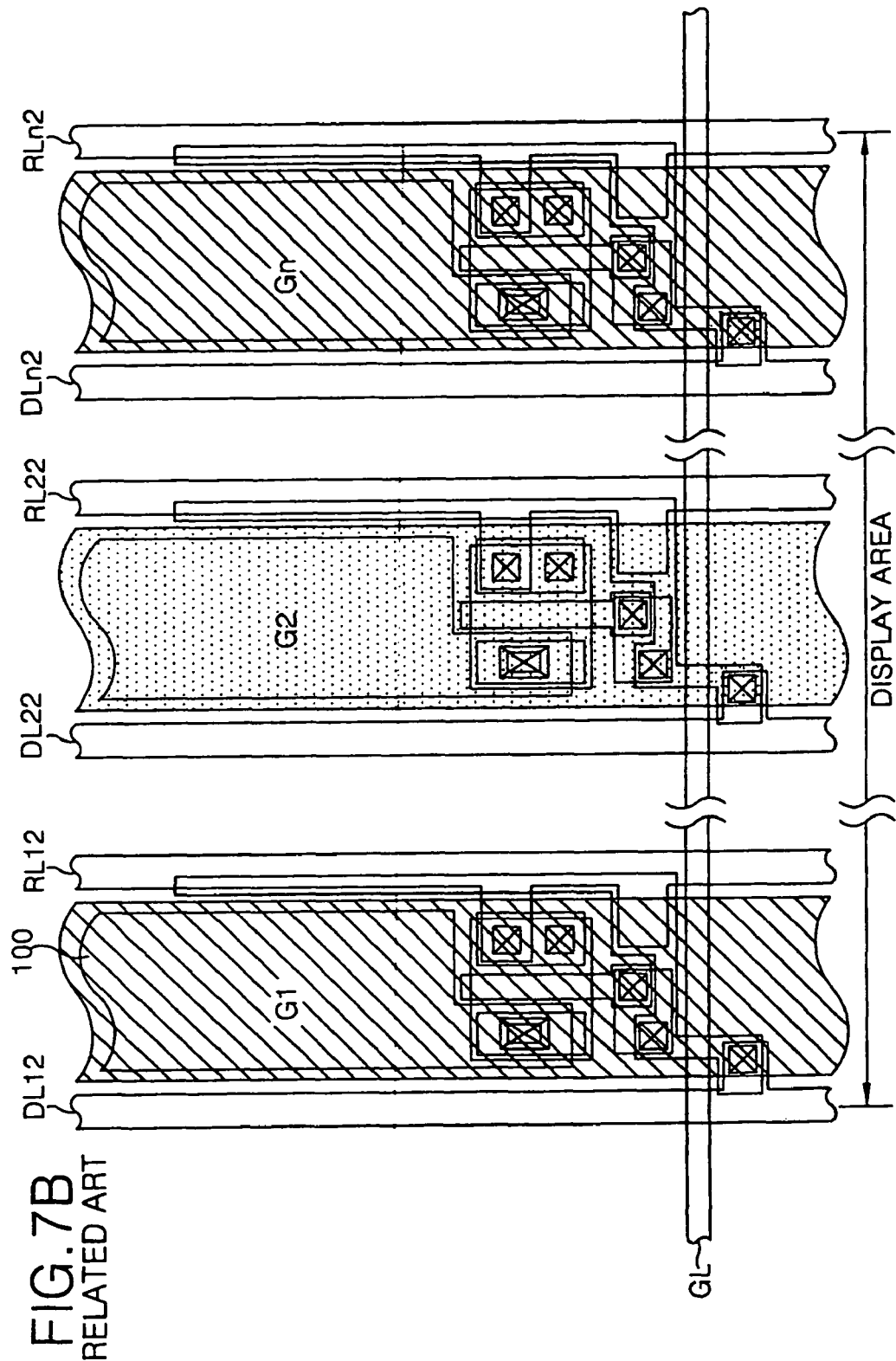
Figure 7C:
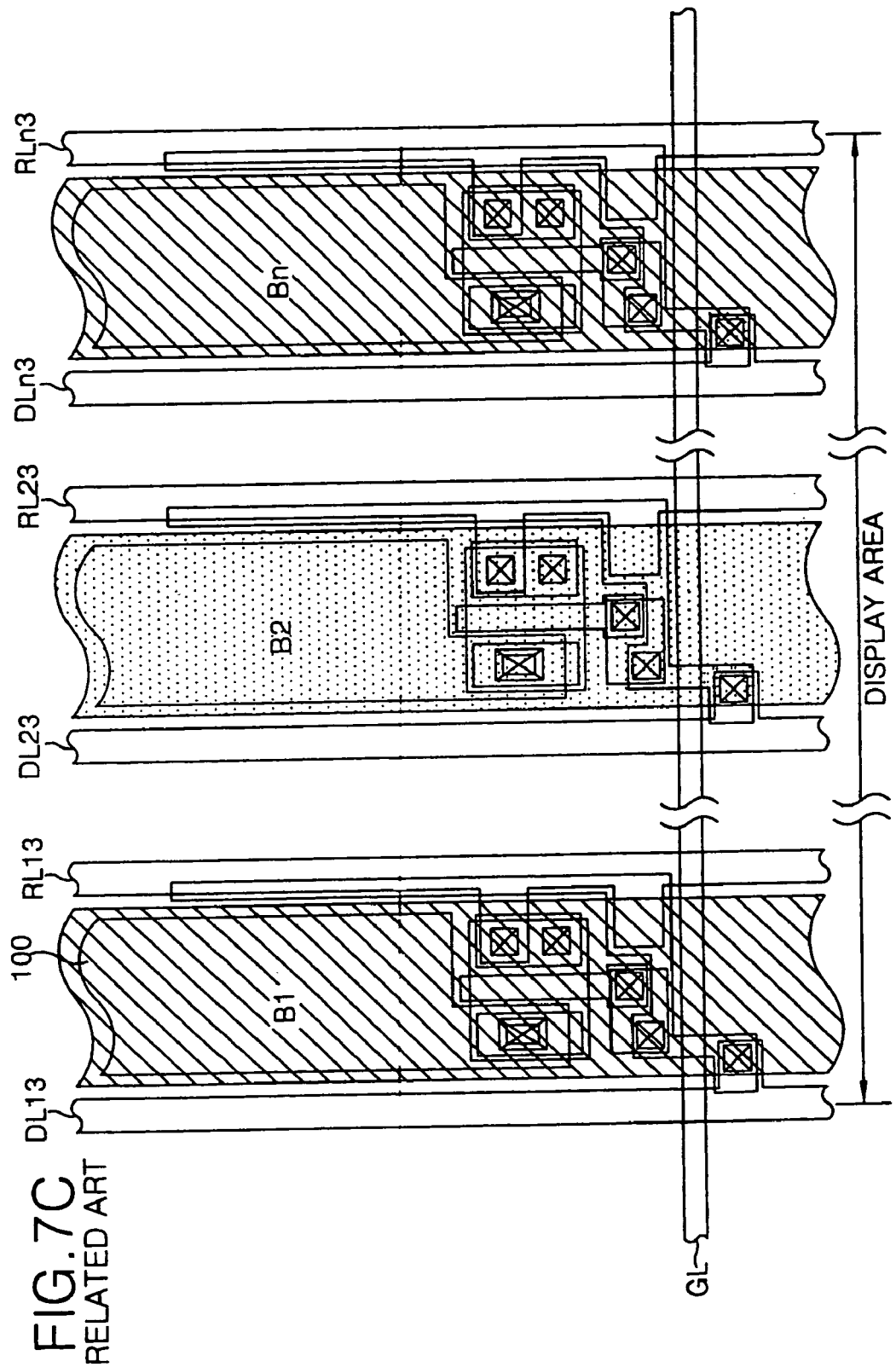
Figure 9:
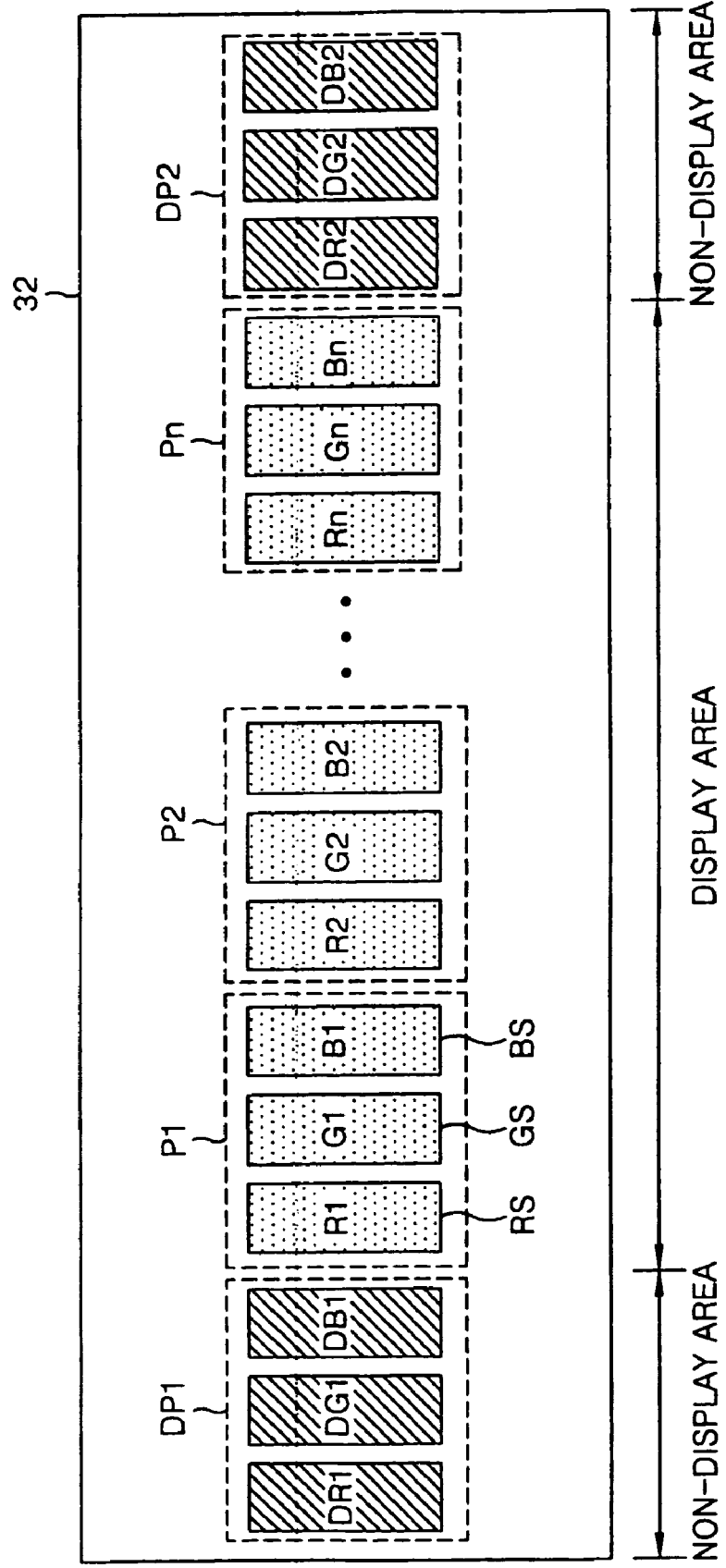
FIG. 9 is a diagram of an electro luminescence display device according to an embodiment of the present invention.

FIG. 9 is a diagram of an electro luminescence display device according to an embodiment of the present invention. Referring to FIG. 9, the organic EL display device includes a display area having first to $n^{th}$ pixels P1 to Pn, which are formed on a substrate 32. In addition, the organic EL display device includes a non-display area having dummy pixels DP1 and DP2, which are formed at both edges or along the sides of the display area.

Figure 10:
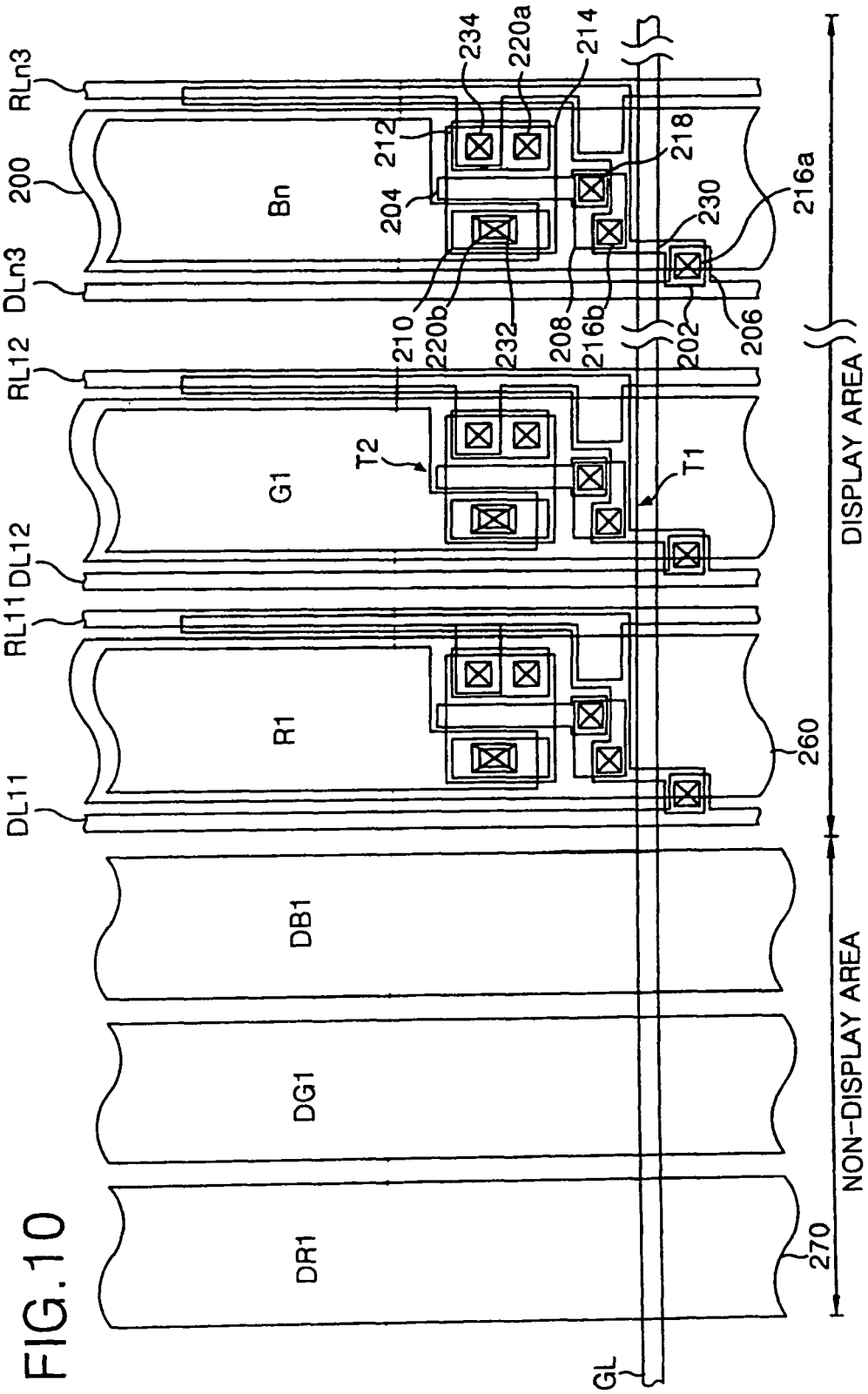
FIG. 10 is a diagram representing in detail a display area and a non-display area shown in FIG. 9.

In the display area, the pixels P are arranged in a matrix, wherein the pixels P each consist of a red, a green and a blue sub-pixels RS, GS and BS that realize the colors of red R, green G and blue B. Each of the sub-pixels RS, GS and BS, as shown in FIG. 10, includes a drive thin film transistor T2 formed adjacent an intersection of the gate line GL and supply line RL for the respective sub-pixel. The drive thin film transistor T2 includes a source electrode 212 connected to a supply voltage source and a gate electrode 204 connected to the switch thin film transistor T1.

The switch thin film transistor T1 includes a gate electrode 230 of the gate line GL, a source electrode 206 connected to the data line DL, and a drain electrode 208 connected to a gate electrode 204 of the drive thin film transistor T2 through a connection contact hole 218. Such a switch thin film transistor T1 further includes an active layer 202 that forms a conduction channel between the source electrode 206 and the drain electrode 208 when a gate voltage is applied to the gate electrode 230. The active layer 202 is connected to the source electrode 206 and the drain electrode 208 through a first and a second switch contact holes 216A and 216B. The switch thin film transistor T1 applies a data signal from the data line DL to the gate electrode 204 of the drive thin film transistor T2 in response to the gate signal from the gate line GL.

The drive thin film transistor T2 includes a gate electrode 204 connected to the drain electrode 208 of the switch thin film transistor T1 through the connection contact hole 218, a source electrode 212 connected to a supply line RL through a supply contact hole 234, and a drain electrode 210 connected to a pixel electrode 200 through a pixel contact hole 232. Such a drive thin film transistor T2 further includes an active layer 214 that forms a conduction channel between the source electrode 212 and the drain electrode 210 when a data signal is applied to the gate electrode 204 from the drain electrode 208 of the switch thin film transistor T1. The active layer 214 is connected to the source electrode 212 and the drain electrode 210 through a first and a second switch contact holes 220A and 220B. Such a drive thin film transistor T2 applies a supply voltage signal VDD from the supply line RL to the pixel electrode 200 in response to the data signal from the gate electrode 204. The pixel electrode 200 acts as an anode. There is formed an organic EL layer 260 that realizes at least one of red, green and blue on the substrate where the pixel electrode 210 is formed. There is formed a cathode (not shown) for forming an electric field with the pixel electrode 200 across organic EL layer 260 to complete the organic EL display panel.

Figure 11:
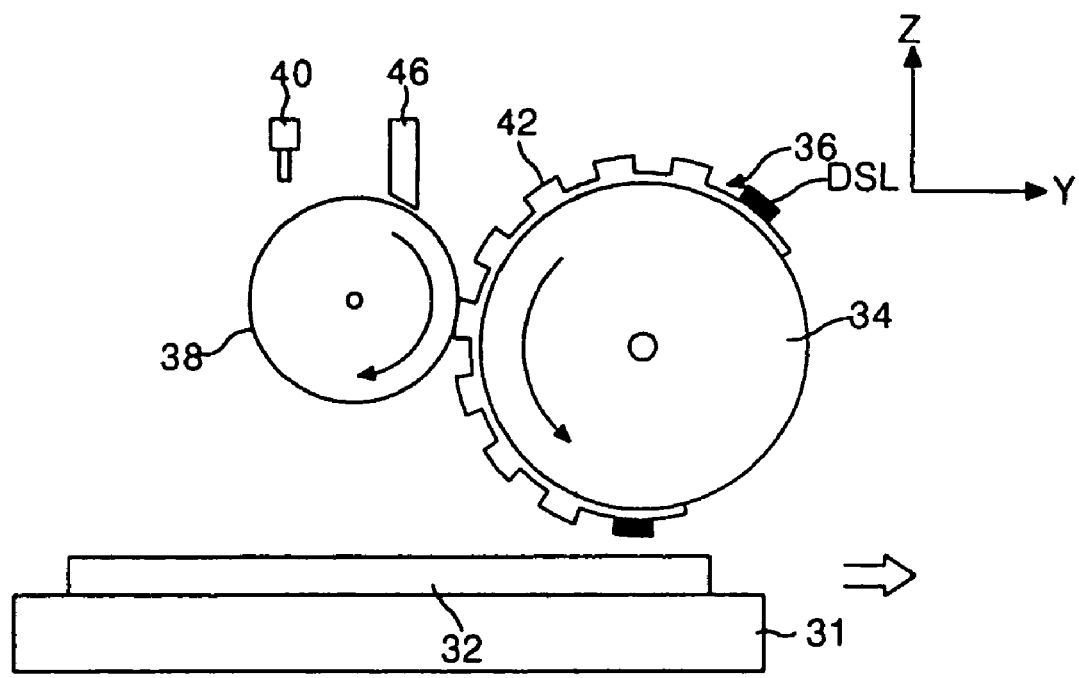
FIG. 11 is a diagram representing a fabricating apparatus of an electro luminescence display device according to an embodiment of the present invention.
Figure 12:
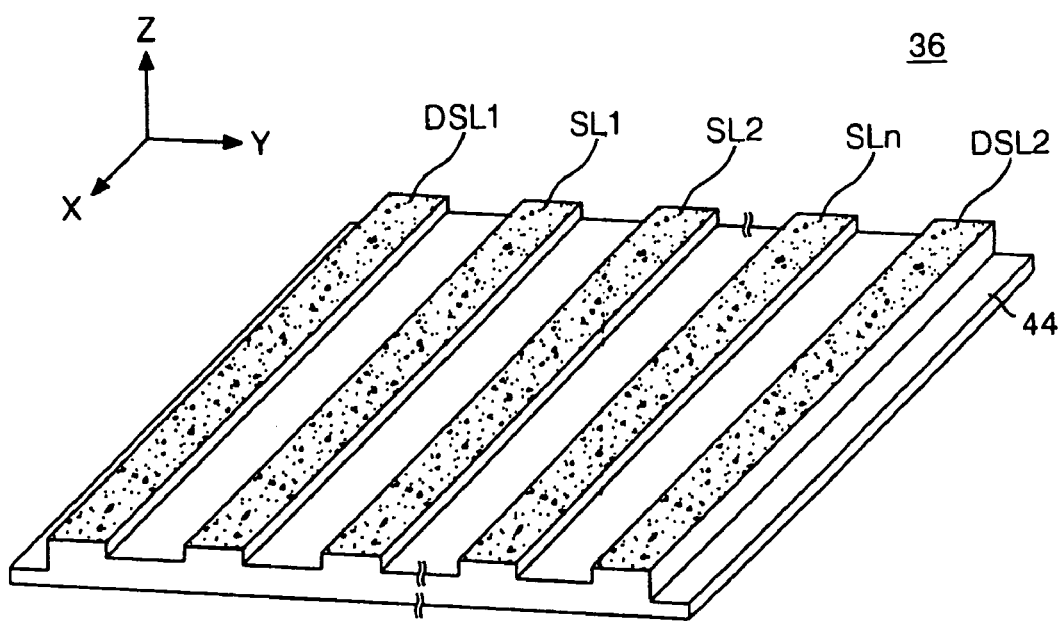
FIG. 12 is a perspective view of the resin plate shown in FIG. 11.

FIG. 11 is a diagram representing a fabricating apparatus of an electro luminescence display device according to an embodiment of the present invention. FIG. 12 is a perspective view of the resin plate shown in FIG. 11. The organic EL layer 260 located in the display area is formed using the first to $n^{th}$ display pattern lines SL1 to SLn except for the dummy pattern lines DSL1 and DSL2 located at the utmost sides of the resin plate 36, as shown in FIG. 12. The first to $n^{th}$ display pattern lines SL1 to SLn are formed to have the same depth on the resin plate 36, as shown in FIG. 11. Thus, the organic EL layer 260 located in the display area and formed using the first to $n^{th}$ display pattern lines SL1 to SLn is formed to have gaps therebetween that have a uniform depth.

Figure 13:
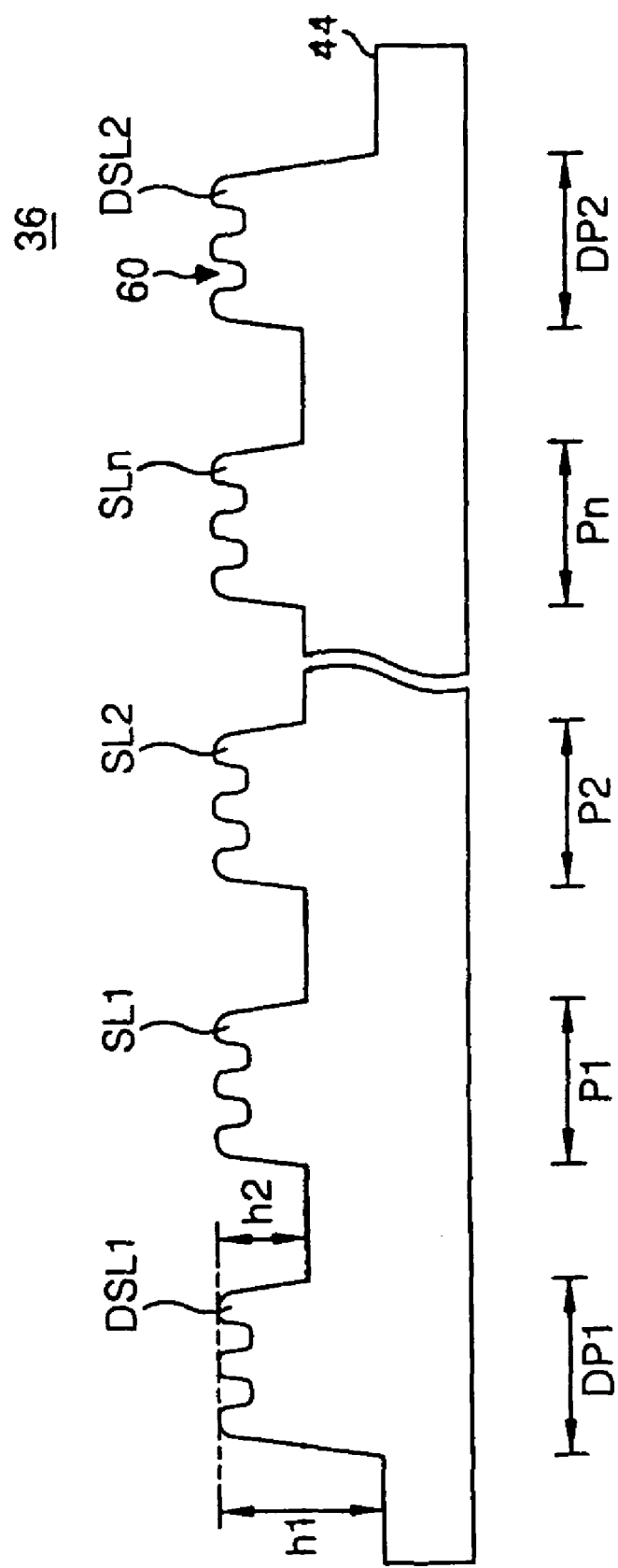
FIG. 13 is a sectional view of the pattern line shown in FIG. 12.

FIG. 13 is a sectional view of the pattern line shown in FIG. 12. The resin plate 36 has a plurality of display concavo-convex patterns P1-Pn formed at an area corresponding to a display area of a substrate and at least one dummy concavo-convex pattern formed at an area corresponding to a non-display area DSL1-DSL2. As shown in FIG. 13, first and second dummy sub-pixels DP1 and DP2 are located outside of the display area in the non-display area. The first and second dummy sub-pixels DP1, DP2 consist of one of red, green and blue dummy organic EL layers 270. The dummy organic EL layer 270 is formed using the dummy pattern lines DSL1 and DSL2 located at the utmost sides of the resin plate 36.

In the meantime, the first and second dummy sub-pixels DP1 and DP2 may include a separate switch thin film transistor T1, a separate drive thin film transistor T2 and a separate pixel electrode 200 in order to drive the organic EL layer 270. According to the above scheme, if the dummy organic EL layer 270 and the organic EL layer 260 are formed exactly, it is possible to represent pictures on the first and second dummy sub-pixels DP1 and DP2 in response to the driving signals supplied through the gate line GL, the data line DL and the supplying line RL.

The organic EL display device according to the present embodiment forms dummy organic EL layers 270 with dummy pattern lines DSL at both edges of the display area. Meanwhile, the organic EL layers 260 of the display area are formed using pattern lines SL. Because the organic EL layers 260 are formed using display pattern lines having gaps of a uniform depth, the brightness and the picture quality of the electro luminescence display device are uniform across the entire display area.

Referring to FIG. 11, a fabricating apparatus of the electro luminescence display device includes a supply roller 38 on which an EL material is spread, a print roller 34 to which a resin plate 36 is attached for holding the EL material spread from the surface of the supply roller 38, and a substrate 32 loaded under the print roller 34. One of red R, green G and blue B EL materials is dropped onto the supply roller 38 from a dispenser 40 installed on top of it. The supply roller 38 is installed so as to rotate while being in contact with the resin plate 36 attached to the print roller 34, and acts to spread the EL material onto the resin plate 36. A blade 46 or a roller is installed close to the surface of the supply roller 38 to uniformly spread the EL material on the supply roller 38.

The print roller 34 causes the EL material from the supply roller 38 to be spread onto the display pattern lines SL and the dummy pattern lines DSL of the resin plate 36 by rotational motion. Further, the print roller 34 causes the display pattern lines SL and the dummy pattern lines DSL of the resin plate 36, on which the EL material is spread, to be in contact with the substrate 32 by rotational motion, thereby forming the EL pattern and the dummy EL pattern on the substrate 32.

The resin plate 36, as shown in FIGS. 12 and 13, includes a base surface 44, a first to an $n^{th}$ display pattern lines SL1 to SLn formed to be projected from the base surface 44, and dummy pattern lines DSL1 and DSLn located at the outer area of the base surface 44. The first to $n^{th}$ display pattern lines SL1 to SLn are formed at locations corresponding to a first to an $n^{th}$ sub-pixel areas P1 to Pn on the substrate 32 in the same shape as the sub-pixel formed on the substrate 32. The first to $n^{th}$ display pattern lines SL1 to SLn are formed to have gaps with a second depth h2 between each other. Thus, there is no variation in printing due to pattern lines having gaps with varying depths therebetween that can cause a pattern line to print differently than other pattern lines.

At least one or more dummy pattern lines DSL1 and DSL2 are formed at the peripheral area of the base surface 44. The dummy pattern lines DSL1 and DSL2 are formed at locations corresponding to the non-display area of the substrate 32 in the same shape as the pixel formed on the substrate 32. Such dummy pattern lines DSL1 and DSL2 are formed to have a gap with a first depth h1 on the side surface adjacent to the side of the base surface 44, and a gap with a second depth h2 on the side surface adjacent to the first and $n^{th}$ display pattern lines SL1 and SLn, wherein the second depth h2 is lower than the first depth h1.

The display pattern lines SL are formed in a stripe form with a designated gap therebetween. On the surface of the display pattern line SL and the dummy pattern line DSL, there are formed a plurality of hemispherical shape grooves 60, as shown in FIG. 13. The display pattern line SL and the dummy pattern line DSL contact the supply roller 38 on which the EL material is spread, so that the EL material is uniformly spread on the display pattern line SL and the dummy pattern line DSL with a designated thickness to be transferred onto the substrate 32.

A print table 31 having the substrate 32, which is to be printed, placed is loaded by a loading device (not shown) below the print roller 34. The substrate 32 can have an electrode pattern and various material layers formed thereon for an EL display device configuration. More particularly, the following describes the operation of the fabricating apparatus of the organic EL display device according an embodiment of the present invention.

Figure 14A:
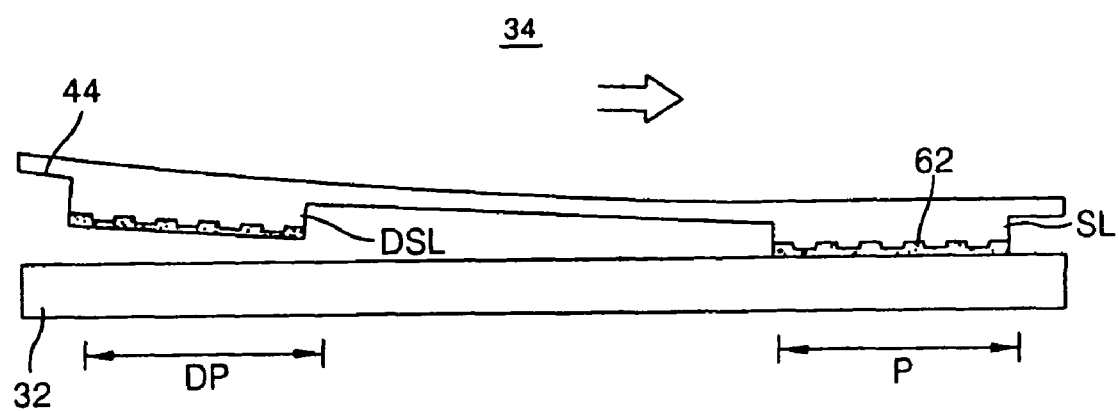
FIG. 14A to 14C are sectional views representing a step by step a process of forming a pattern for an electro luminescence display device using the fabricating apparatus shown in FIG. 11.
Figure 14B:
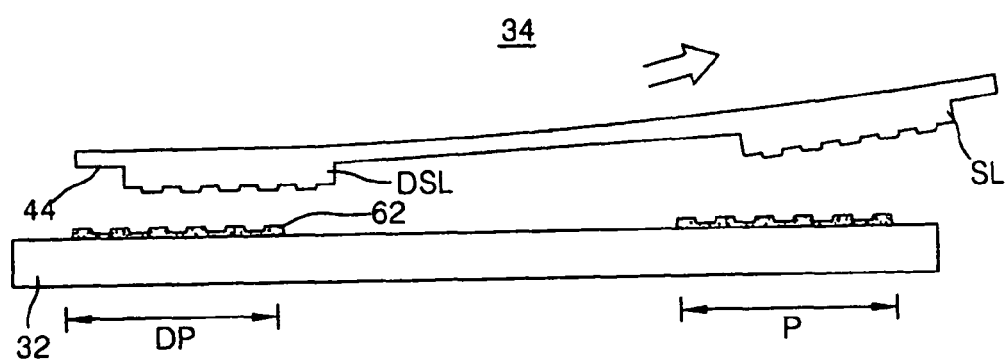
Figure 14C:
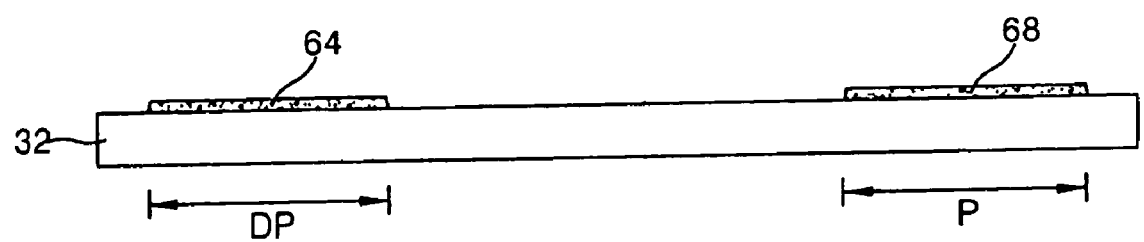

FIG. 14A to 14C are sectional views representing a step-by-step process of forming a pattern for an electro luminescence display device using the fabricating apparatus shown in FIG. 11. First, the loading device (not shown) loads the substrate 32 placed in the print table 31. After the substrate 32 is loaded, at least one of the red, green and blue EL materials is supplied from the dispenser 40 to the supply roller 38. The EL material is transferred to the display pattern lines SL and the dummy pattern lines DSL of the resin plate 36 by the rotating supply roller 38. At this moment, the print roller 34 rotates in an opposite direction to the supply roller 38 in connection with the rotating supply roller 38. The organic EL material spread on the display pattern lines SL and the dummy pattern lines DSL of the resin plate 36 is in contact with the substrate 32, which is located below the print roller 34, by the rotational motion of the print roller 34. At this moment, the organic EL material 62 spread on the display pattern line SL of the resin plate 36, as shown in FIG. 14A, is transferred to the pixel P located at the display area of the substrate 32, and the organic EL material 62 spread on the dummy pattern line DSL is also transferred to the dummy pixel DP of the non-display area of the substrate 32.

The display pattern line SL and the dummy pattern line DSL printed with the organic EL material 62, as shown in FIG. 14B, are then separated from the substrate 32 by the rotation of the print roller 34. The organic EL material 62 printed on the substrate 32, as shown in FIG. 14C, is changed for the surface to be flat right after printing. Subsequently, the organic EL material 62 on the substrate 32 is fired with a designated temperature to form the EL layer 68 and the dummy EL layer 64 on the substrate 32. In this way, the EL layer 68 and the dummy EL layer 64 of a specific color, such as red, is formed, and then the EL layers 68 and the dummy EL layers 64 of the other colors, such as green and blue, are formed in the same way.

As described above, the electro luminescence display device and the fabricating method and apparatus thereof according to the present invention has the dummy pattern line located on the resin plate corresponding to the non-display area of the substrate. The dummy pattern line causes the first and $n^{th}$ pattern lines to have gaps about them that are the same depth. Accordingly, the EL layer as the dummy pattern line is formed on the non-display area of the substrate, and the EL layer as the first and $n^{th}$ pattern lines having gaps with the same depth are formed on the display area of the substrate. Thus, bad picture quality of the electro luminescence display device can be prevented.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A fabricating method of an electro luminescence display device, comprising:
    attaching to a roller a resin plate with a plurality of display concavo-convex patterns formed at a location corresponding to a display area of a substrate and with at least one dummy concavo-convex pattern formed at a location corresponding to a non display area of the substrate;
    supplying an organic material to the resin plate; and
    printing the organic material spread on the resin plate to the substrate by rotating the roller,
    wherein each of convex surfaces of the display concavo-convex patterns and the dummy concavo-convex pattern has a hemispherical shape with a same size, wherein the resin plate has a first base surface formed between outmost one of the display concavo-convex patterns and the dummy concavo-convex pattern and a second base surface formed on outer side of the dummy concavo-convex pattern, wherein a height from the first base surface to the convex surface of the display concavo-convex patterns is smaller than a height from the second base surface to the convex surface of the dummy concavo-convex pattern, and wherein a height of the first base surface is different from that of the second base surface.

2. The fabricating method according to claim 1, wherein the resin plate has the dummy concavo-convex pattern with a gap having different depth on at least one side surface of the dummy concavo-convex pattern.

3. The fabricating method according to claim 1, wherein the resin plate has the display concavo-convex patterns with gaps having a uniform depth in between the display concavo-convex patterns.

4. The fabricating method according to claim 1, further comprising repeating the steps to form a plurality of organic light emission layers of red, green and blue are formed in the display area of the substrate, and to form at the same time a dummy organic light emission layer of red, green and blue in the non-display area of the substrate.

5. The fabricating method according to claim 4, wherein at least one dummy pixel is formed in the non-display area, the dummy pixel being composed of the dummy organic light emission layer.

* * * * *